United States Patent
Neurauter et al.

(10) Patent No.: US 7,391,270 B2
(45) Date of Patent: Jun. 24, 2008

(54) PHASE LOCKED LOOP AND METHOD FOR PHASE CORRECTION OF A FREQUENCY CONTROLLABLE OSCILLATOR

(75) Inventors: Burkhard Neurauter, Linz (AT); Günter Märzinger, Ulrichsberg (AT); Christian Münker, München (DE); Roland Vuketich, Naarn (AT)

(73) Assignee: Infineon Technologies AG, Munich (DE)

( * ) Notice: Subject to any disclaimer, the term of this patent is extended or adjusted under 35 U.S.C. 154(b) by 94 days.

(21) Appl. No.: 11/086,039

(22) Filed: Mar. 22, 2005

(65) Prior Publication Data

US 2006/0082417 A1 Apr. 20, 2006

(30) Foreign Application Priority Data

Mar. 23, 2004 (DE) .................. 10 2004 014 204

(51) Int. Cl.
*H03L 7/00* (2006.01)
(52) U.S. Cl. .................... 331/16; 331/23; 331/34; 327/156; 332/127
(58) Field of Classification Search ............ 331/16, 331/DIG. 2, 34, 23; 327/156; 332/127, 128
See application file for complete search history.

(56) References Cited

U.S. PATENT DOCUMENTS

| | | | | |
|---|---|---|---|---|
| 4,994,768 | A * | 2/1991 | Shepherd et al. | 332/127 |
| 6,157,271 | A * | 12/2000 | Black et al. | 332/127 |
| 6,359,950 | B2 * | 3/2002 | Gossmann et al. | 375/376 |
| 6,429,693 | B1 | 8/2002 | Staszewski et al. | |
| 6,924,706 | B2 * | 8/2005 | Balm et al. | 331/17 |
| 7,015,738 | B1 * | 3/2006 | Cao | 327/159 |

FOREIGN PATENT DOCUMENTS

| | | |
|---|---|---|
| EP | 0 735 693 A1 | 10/1996 |
| JP | 2001-298363 A | 10/2001 |
| WO | WO00/14879 | 3/2000 |

OTHER PUBLICATIONS

"A Pipelined Noise Shaping Coder for Fractional-N Frequency Synthesis", Mücahit Kozak and Izzet Kale, IEEE Transactions on Instrumentation and Measurement, vol. 50, No. 5, Oct. 2001, pp. 1154-1161.

* cited by examiner

*Primary Examiner*—Robert J. Pascal
*Assistant Examiner*—Levi Gannon
(74) *Attorney, Agent, or Firm*—Eschweiler & Associates, LLC

(57) ABSTRACT

A phase locked loop is disclosed and includes a frequency divider circuit with a settable division ratio in a feedback path. The division ratio is produced using a control circuit which, besides an input for supplying the integer and fractional components for the frequency division ratio which is to be set, includes an input for supplying a phase correction signal. To produce the phase correction signal, the phase locked loop further includes a phase correction apparatus. The phase correction signal preferably contains a signal component with an exponential profile, and is supplied to the control circuit for producing a frequency division ratio for the frequency divider circuit such that it compensates for a phase drift in the output signal from the voltage controlled oscillator in the phase locked loop.

22 Claims, 4 Drawing Sheets

PHASE LOCKED LOOP AND METHOD FOR PHASE CORRECTION OF A FREQUENCY CONTROLLABLE OSCILLATOR

REFERENCE TO RELATED APPLICATIONS

This application claims the benefit of the priority date of German application DE 10 2004 014 204.1, filed on Mar. 23, 2004, the contents of which are herein incorporated by reference in their entirety.

FIELD OF THE INVENTION

The invention relates to a phase locked loop, and to a method for phase correction of a frequency controllable oscillator in a phase locked loop.

BACKGROUND OF THE INVENTION

Phase locked loops are used in various applications and particularly in communication devices to produce output signals at a stable frequency. To this end, a phase locked loop contains a frequency controllable and voltage controlled oscillator whose output signal connection is usually connected to a frequency divider. The frequency divider divides the output signal using a particular division ratio and supplies the divided signal to a phase detector. The phase detector compares the phase of the divided signal with the frequency of a reference signal and produces a regulating signal therefrom in order to set the output frequency of the voltage controlled oscillator. The regulating signal is supplied via a loop filter to the voltage controlled oscillator, which uses it to readjust its output frequency and thus to compensate for the discrepancy.

To obtain a plurality of different output frequencies from the phase locked loop, it is appropriate to implement the frequency divider with an adjustable division ratio. Such a frequency divider is also called a multimodulus divider. The division ratio of the multimodulus divider is set using an actuating signal. The document "A Pipelined Noise Shaping Coder for Fractional-N Frequency Synthesis", IEEE Transactions on Instrumentation and Measurement, Vol. 50, No. 5, October 2001 by Mücahit Kozak et al presents a phase locked loop with a frequency divider whose division ratio is set using a MASH modulator (multistage noise shaping modulator). A MASH modulator is a specific embodiment of a delta-sigma ($\Delta$-$\Sigma$) modulator and is particularly suitable for providing very fine-resolution actuating signals for the purpose of setting the division ratio of the frequency divider.

Frequency dividers whose division ratio can thus be set very quickly using a MASH modulator are preferably used in phase locked loops.

The freewheeling frequency of a voltage controlled oscillator and also the loop gain of phase locked loops have an unavoidable drift. The reason for this is the inherent heating of the voltage controlled oscillator or a drift in reference currents or reference voltages within the control loop. This drift, also referred to as phase transient, results in a slow change in the phase of the output signal. The integral relationship between phase and frequency means that a phase drift over this time also produces a frequency offset in the output signal from the oscillator.

The brief frequency error and also the phase transient are largely corrected in the phase control loop using a loop filter which is characterized by an integrating response. In this context, a phase locked loop with an integrating loop filter is referred to as a type II phase locked loop. If a loop filter with a nonintegrating response is used in the phase locked loop instead of an integrating loop filter, the brief frequency error or the phase drift becomes markedly more noticeable.

Particularly in the case of modulation methods for telecommunication standards in which the information is held in the phase, the phase drift of a phase locked loop is superimposed on a phase modulation and thus corrupts the actual useful signals. Examples of modulation methods with phase modulation are FSK (Frequency Shift Keying) or PSK (Phase Shift Keying) modulations, such as are used in the GSM mobile radio standard. OFDM (Orthogonal Frequency Division Multiplexing) modulation is also particularly sensitive to changes in the phase.

However, a loop filter with a nonintegrating response which is connected between the output of the phase detector and the actuating input of the voltage controlled oscillator has the advantage of a flat group delay time. This allows low-distortion transmission of the regulating signals and likewise permits direct frequency modulation of the output signal from the control loop with a useful signal. In addition, a nonintegrating loop filter is insensitive toward leakage currents within the charge pump and also has a greater degree of linearity between the signal which is output by the phase detector and the actuating signal which is output by the loop filter to the voltage controlled oscillator. The use of a nonintegrating loop filter therefore permits much higher transmission rates for particular modulation methods.

An example of such a drift in a voltage controlled oscillator in a phase locked loop is shown in FIG. 5. In this case, the phase locked loop contains a nonintegrating loop filter (type I phase locked loop). The time is plotted along the x axis, and in the present measuring range is 600 µs. The y axis shows the phase in relation to a reference phase. The figure clearly shows the exponentially decreasing profile of the phase drift over the measured time.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to a phase locked loop in which the phase drift in the output signal from the control loop is reduced. The invention also includes a method for phase correction of the output signal from a phase locked loop.

In accordance with one embodiment of the invention, a phase locked loop comprises a phase detector having a reference input, a feedback input and a control output. The phase detector is configured to output a control signal on the basis of a phase comparison at the reference input and at the feedback input for applied signals. The control output of the phase detector is coupled to a loop filter that is configured to produce and output a regulating signal.

The phase locked loop also comprises a voltage controlled oscillator having an output for outputting an output signal at a particular frequency. The voltage controlled oscillator also contains a regulating input which is coupled to an output of the loop filter. The frequency of the output signal from the voltage controlled oscillator can be set by the regulating signal at the regulating input thereof.

Connected in a feedback path of the phase locked loop is a frequency divider circuit having an adjustable frequency division ratio. An input of the frequency divider circuit is connected to the output of the voltage controlled oscillator, and an output of the frequency divider circuit is coupled to the feedback input of the phase detector. The frequency divider circuit is configured to output a signal at a frequency which is derived from the output signal frequency of the voltage controlled oscillator and from the set frequency division ratio. The frequency divider circuit thus divides a signal applied to its input by the frequency division ratio which is set by means of a setting signal applied to the setting input.

In addition, a control circuit configured to produce and output the setting signal for setting the frequency division ratio of the frequency divider circuit is provided. In this case, the control circuit is configured to produce the setting signal from a signal which is applied at least to a first input and from a phase correction signal applied to a second input. Finally, the inventive phase locked loop comprises a phase correction apparatus which is designed to output a phase or frequency correction signal to the second input of the control circuit. In this case, the phase correction signal is derived from a time profile of a phase drift in the output signal from the voltage controlled oscillator.

As a result, the control circuit and the phase correction apparatus are used to set the frequency division ratio of the frequency divider circuit such that the inventive phase locked loop compensates for the phase shift in the voltage controlled oscillator's output signal which is caused by the drift. In this case, the invention appreciates that an alteration in a phase in the voltage controlled oscillator's output signal over time corresponds to a phase drift. This phase drift is compensated for by the additionally introduced frequency correction signal to the control circuit, which takes the phase drift into account when producing the setting signal for the frequency division ratio.

In this case, it is particularly advantageous to produce the loop filter as a loop filter with a nonintegrating response. The absent integrating response, which normally largely corrects any phase drift, is in this case replaced by the phase correction apparatus and the frequency correction signal. The present invention thus makes use of the advantages of a loop filter with a nonintegrating response for implementing a phase locked loop without needing to accept a phase drift in the output signal from the voltage controlled oscillator in the phase locked loop. In particular, the present invention advantageously allows higher data rates to be achieved in the case of direct modulation of the phase locked loop.

One embodiment of the invention includes the frequency divider circuit comprising a multimodulus divider having a frequency division ratio that can be set in discrete steps. If the control circuit is of suitable design with a MASH modulator, it is thus possible to change over the division ratio of the multimodulus divider between various division values. The sequence of the division values is produced in suitable fashion by the control circuit such that a much finer resolution for the division ratios of the frequency divider can be set on average over time. The finer resolution as a result of the use of the control circuit of the present invention additionally allows direct digital modulation of the phase locked loop too. This allows the phase locked loop to be used directly as a GMSK, FSK or PSK modulator.

In another embodiment of the invention, the phase correction apparatus comprises an exponential function generator configured to produce a frequency correction signal having a signal component with an exponential profile. Preferably, the exponential function generator is designed with a plurality of adjustable function parameters for producing the signal component. This allows a suitable frequency correction signal with an exponential profile to be produced which compensates for the exponentially decreasing phase drift. A plurality of such generators, in one example, are connected together in suitable fashion in order to simulate more complex behaviors of a phase drift over time. The adjustable parameters allow the correction signal to be matched to the phase drift in the voltage controlled oscillator in optimum fashion.

In another embodiment of the invention, the phase correction apparatus has an input connected to the output of the loop filter or to the output of the voltage controlled oscillator. The phase correction apparatus is preferably configured to produce the phase or frequency correction signal on the basis of the regulating signal from the loop filter or the output signal from the voltage control oscillator. Accordingly, the production of the phase or frequency correction signal can be adaptively regulated by means of a measured phase drift by evaluating the regulating signals from the loop filter or the output signal from the voltage controlled oscillator.

A method for phase correction of a voltage controlled oscillator in a phase locked loop according to one embodiment of the invention comprises providing a voltage controlled oscillator (VCO) in a phase locked loop having a phase or frequency correction signal which compensates for a phase drift in an output signal thereof over time. The method further comprises setting a frequency division ratio for a frequency divider circuit in a feedback path of the phase locked loop based on the phase or frequency correction signal. A frequency of the VCO output signal is divided by the set frequency division ratio in the feedback path, and the divided frequency signal is fed back and compared with a reference signal. A regulating signal is produced from the comparison and the regulating signal is applied to the voltage controlled oscillator in order to set the output frequency thereof.

By producing a frequency division ratio on the basis of the phase correction signal, the VCO output signal is divided by different frequency division ratios. The regulating signal produced by the phase detector and the comparison alters the resultant VCO output frequency such that a phase drift in the voltage controlled oscillator is compensated for.

Preferably, in one embodiment the phase correction signal is produced with a signal component having an exponential profile. This is particularly advantageous since a phase drift in the VCO output signal primarily has an exponential profile. Preferably, the frequency division ratio is produced by supplying an integer component, a fractional component and a phase or frequency correction signal.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in detail below using exemplary embodiments with reference to the drawing, in which.

DETAILED DESCRIPTION OF THE INVENTION

Figure 1:
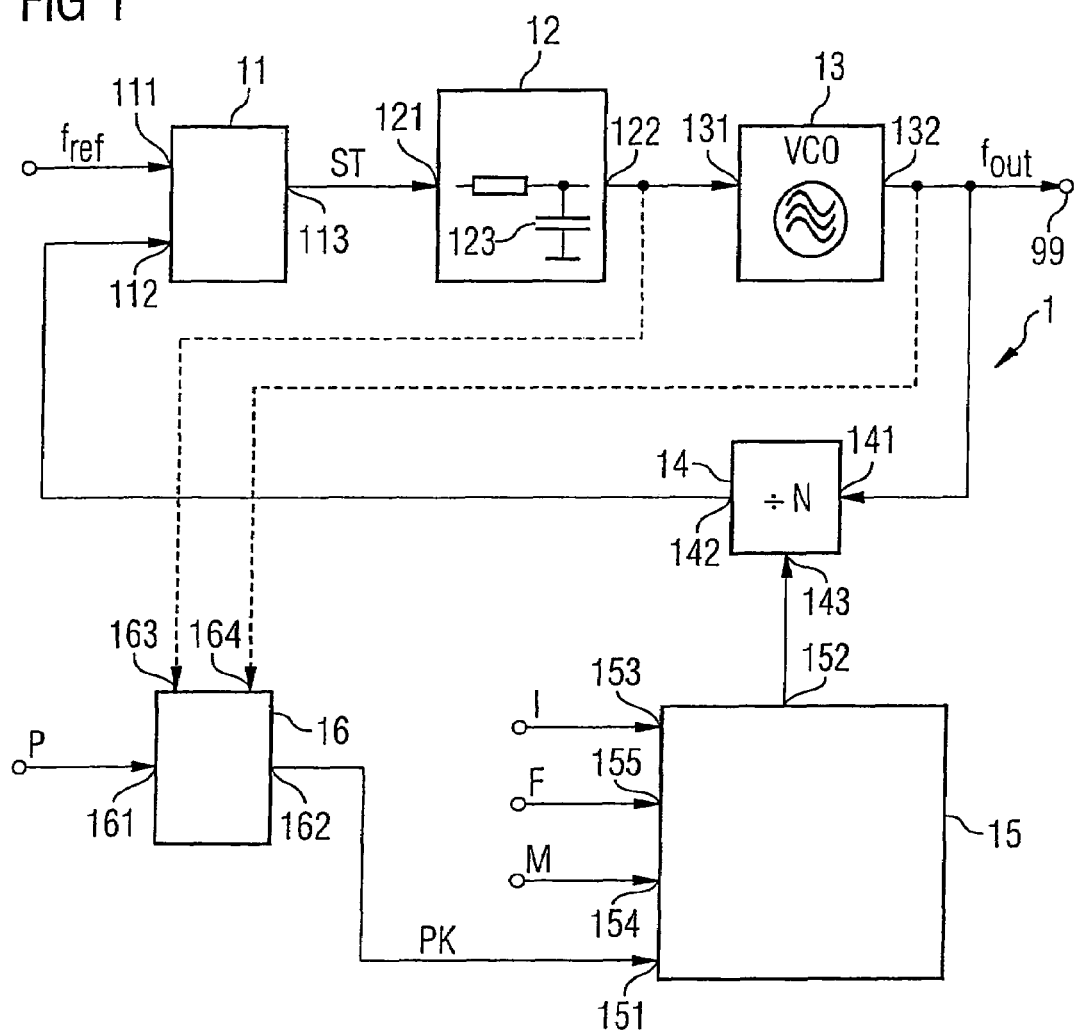
FIG. 1 is a block diagram illustrating a phase locked loop circuit with phase drift compensation according to one exemplary embodiment of the present invention.

FIG. 1 shows a phase locked loop according to one embodiment of the invention. In one example, the phase locked loop is part of a transmission path (not shown here for reasons of clarity) in a mobile communication appliance for the GSM mobile radio standard. The inventive phase locked loop is designed for modulation using a frequency shift keying method. A frequency shift keying method is likewise referred to as FSK modulation. A phase locked loop designed for FSK modulation can advantageously be used in a particularly simple manner to modulate binary information directly onto the output signal from the phase locked loop.

The phase locked loop comprises a forward path comprising a phase detector 11, a loop filter 12 and a voltage controlled oscillator 13. The phase detector 11 contains a reference input 111 for supplying a reference signal $f_{ref}$. A second input 112 forms a feedback input of the phase detector 11. The phase detector 11 is designed to compare the frequencies of signals applied to the input. If the frequencies are different, it produces a control signal ST which is proportional to the difference. It outputs this signal at a control output 113. The control output 113 of the phase detector 11 is connected to an input 121 of the loop filter 12.

The loop filter 12 in one embodiment comprises a loop filter with a nonintegrating response. The output 122 of the nonintegrating loop filter 12 is connected to a regulating input 131 of the voltage controlled oscillator 13 in the forward path of the inventive phase locked loop. On the basis of the regulating signal at the regulating input 131, the voltage controlled oscillator 13 outputs an output signal at the output frequency $f_{out}$ at its output 132. This signal simultaneously forms the output signal for the output 99 of the inventive phase locked loop. At the same time, the output signal at its frequency $f_{out}$ is supplied to the input 141 of a frequency divider circuit 14. The frequency divider circuit 14 in one example comprises a multimodulus divider. It divides the frequency $f_{out}$ of the signal applied to the input by a division ratio N (which is set using a setting input 143) and sends the divided signal to the output 142, which is connected to the feedback input 112, a signal at a frequency $f_{out}/N$ which is divided in line with the division ratio.

To set the frequency division ratio of the frequency divider circuit 14, a control circuit 15 is provided. In one embodiment of the invention, the control circuit comprises a MASH modulator. The control circuit 15 comprises three inputs 153, 154 and 155. The input 153 has a signal applied to it which represents the integer component of the frequency division ratio I for the frequency divider circuit. The input 155 has a digital data word applied to it which characterizes the fractional component F for the target frequency $f_{out}$ of the output signal from the voltage controlled oscillator. The input 154 has a digital modulation word M applied to it. This corresponds to the modulation of the output signal from the phase locked loop for the frequency shift keying.

From the integer component I and the fractional component F of the frequency division ratio, the control circuit produces the setting signal for the division ratio N and supplies it at an input 143 of the divider circuit 14. By changing the digital data words I and F, it is possible to alter the output signal of the frequency $f_{out}$ from the phase locked loop, in which a new division ratio is supplied for the frequency divider circuit. Preferably, the phase locked loop is set to one output frequency. The additional modulation word M at the input 154, which word can take two values, changes the division ratio N of the divider circuit 14, and the output signal at the center frequency of $f_{out}$ from the phase locked loop is keyed between two frequencies. The MASH modulator in the control circuit 15 thus allows direct FSK modulation of the phase locked loop 1 to be achieved.

The control circuit 15 also contains a fourth data input 151. This can be supplied with a phase correction word PK. A phase correction word at the data input is time dependent and is taken into account by the control circuit 14 when producing the setting signal for the frequency division ratio.

The fourth data input 151 is connected to a data output 162 of a phase correction circuit 16. The phase correction circuit contains an input 161 for supplying external parameters and also an input 163 and 164. The input 163 is connected to the tap 122 of the loop filter 12, and the input 164 is connected to the output 132 of the voltage controlled oscillator 13 in the phase locked loop 1.

The phase correction circuit 16 continuously evaluates the output signals from the loop filter 12 and also from the voltage controlled oscillator 13 and uses them with the parameters P at the input 161 to produce a phase correction signal PK which is variable over time. The generated correction signal is such that a drift in the phase or in the frequency of the output signal from the control loop is compensated for. To this end, the calculated phase correction signal is supplied via the output 162 to the input 151 of the MASH modulator 15, which uses it to ascertain a new frequency division ratio. The new frequency division ratio is supplied to the frequency divider circuit 14. The divider circuit produces a feedback signal at the feedback input 112 of the phase detector 11, said feedback signal being at a frequency which is determined from the frequency of the signal which is subject of the phase drift and from the new frequency division ratio. The regulating signal produced by the detector 11 and by the loop filter readjusts the voltage controlled oscillator such that the phase or frequency error is compensated for.

Figure 2:
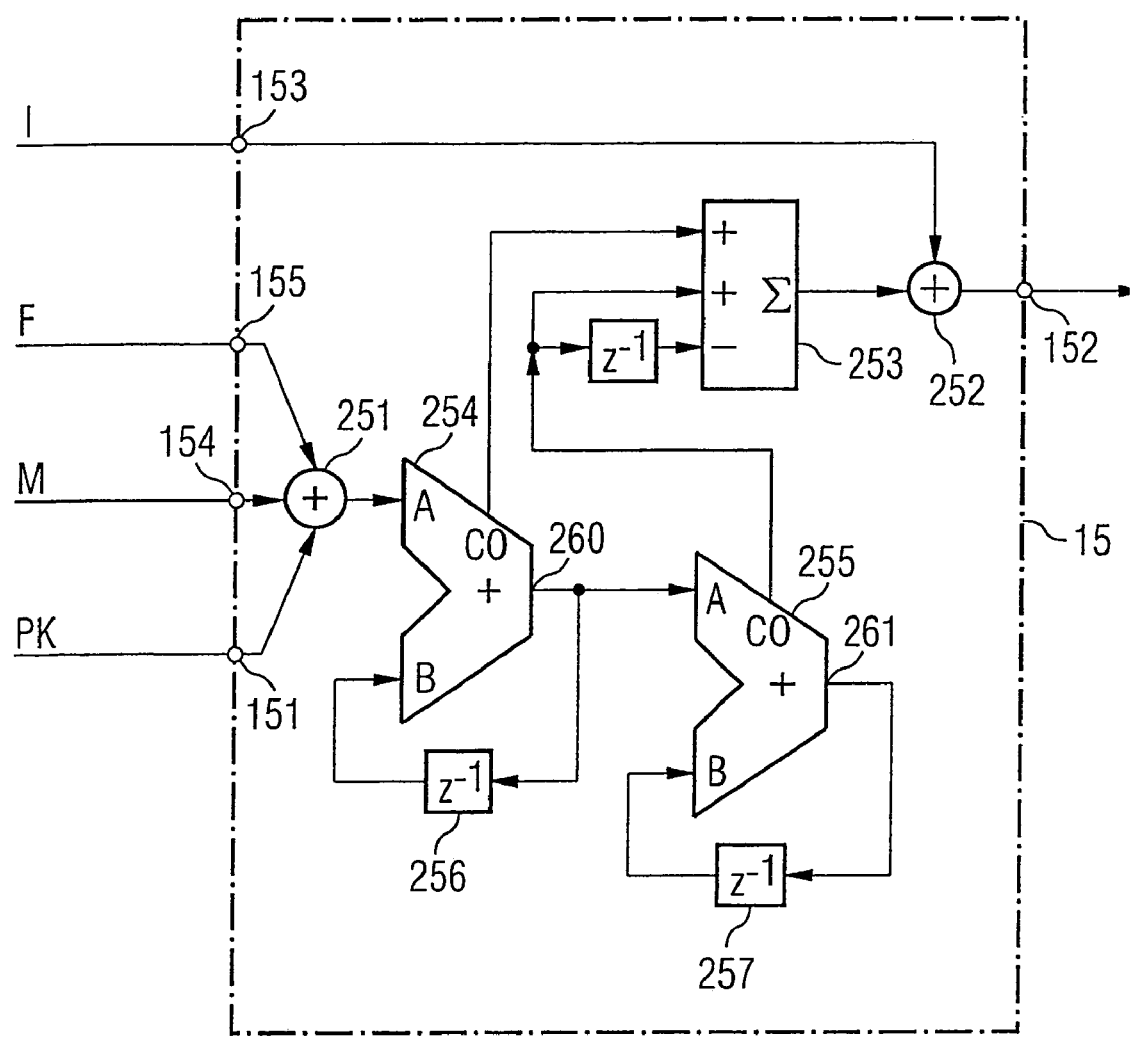
FIG. 2 is a schematic diagram illustrating a MASH modulator according to another embodiment of the invention.

FIG. 2 shows a simplified block diagram of an embodiment of the MASH modulator 15 according to one embodiment of the invention. In this case, identical components bear the same reference symbols.

The integer component I at the data input 153 of the modulator is supplied directly to an adder 252. A further adder 251 adds the fractional components F of the frequency division ratio, which is to be set, to the modulation word M of the input 154. In addition, the phase/frequency compensation word PK is also added to the fractional component F. The output of the adder 251 is connected to a data input A of a first accumulator 254. An output 260 of the accumulator 254 is fed back to the second input B of the accumulator 254 via a delay element 256 or an integrator 256. The signal at the overflow output CO represents a one-bit-quantized output signal. In addition, an output 260 of the first accumulator 254 is connected to the input A of the second accumulator 255. An output 261 of the second accumulator 255 is fed back to its input B via a further delay element 257 of the same type.

The overflow outputs CO of the first and second accumulators 254 and 255 are connected to a respective input of a summator 253. In addition, the overflow output CO of the second accumulator 255 is connected to a delay element 258. The output of the delay element 258 is connected to a third input of the summator 253. The latter sums, as shown, the signals applied to its inputs and supplies them to a second input of the adder 252. The output of the adder is connected to the output 152 in order to output the setting signal for the frequency divider circuit 14.

While the integer divider component I is supplied to the output 152 directly via the adder 252 in order to set the frequency, the fractional components are weighted and a signal is produced which indicates the discrepancy from the integer component on average over time. The form of the control circuit 15 as a two-stage MASH modulator thus allows a much finer resolution than the fixed frequency divider stages of the frequency divider circuit.

The phase/frequency correction word PK of the phase correction apparatus 16 needs to be chosen such that the new frequency division ratio produced by the MASH modulator 15 compensates for the frequency offset which is brought about by the phase drift in the voltage controlled oscillator. In this case, the phase drift in the voltage controlled oscillator usually has a profile which falls exponentially over time. In accordance with the present invention, then, the phase/frequency compensation word PK and hence also the respective frequency division ratios should therefore also contain a corresponding time profile.

Figure 3:
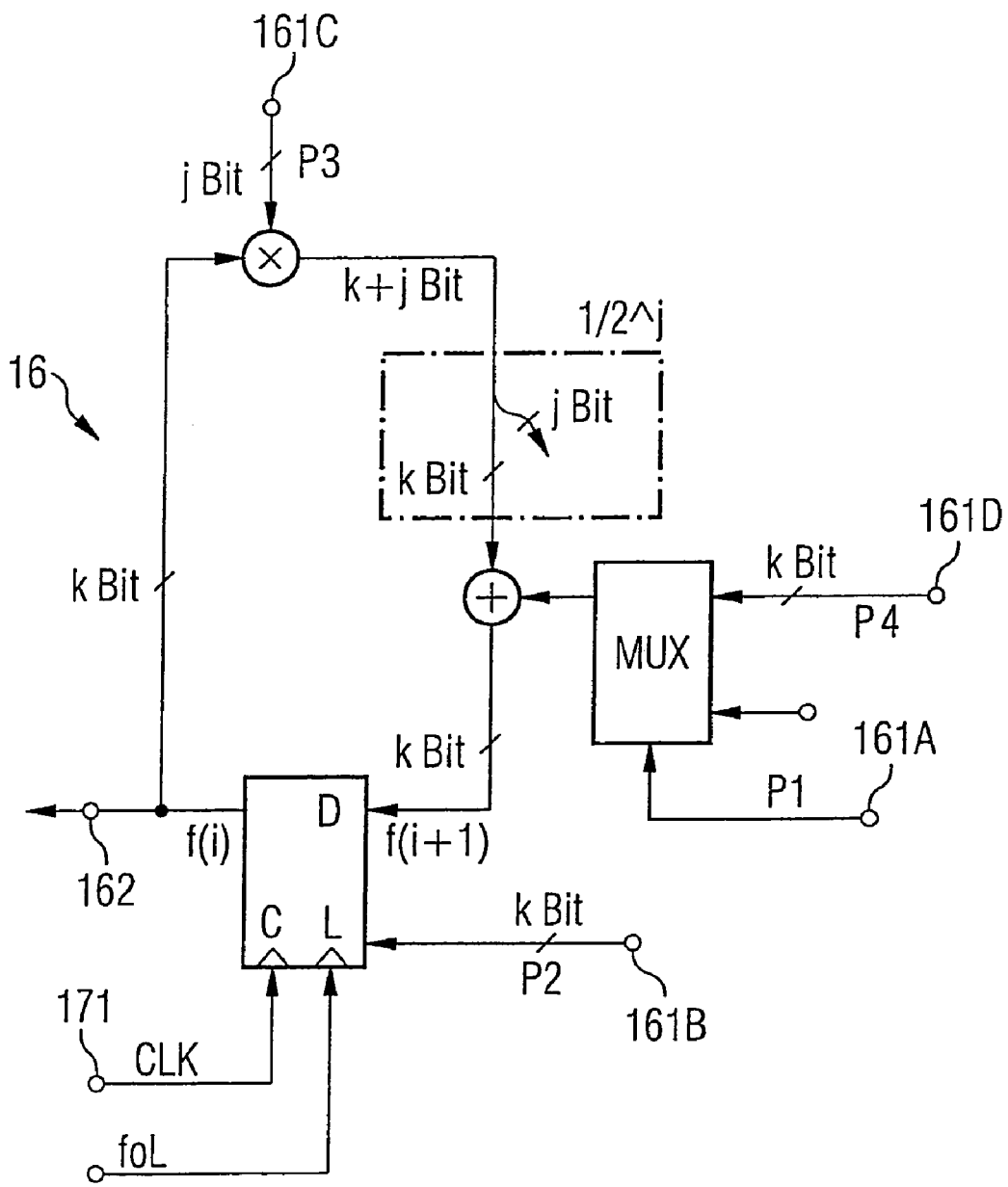
FIG. 3 is a schematic block diagram illustrating an exponential function generator in a phase correction apparatus according to yet another embodiment of the invention.

A block diagram of a generator for producing a naturally exponential signal profile in line with the specification $A(t) = P4*exp(P1*P3*CLK/P2)$ is shown in FIG. 3. The exponential function generator circuit shown in schematically simplified form therein can be set in optimum fashion using the parameters P1, P2, P3 and P4 at the inputs 161A to 161D. In this case, the parameter P1 indicates whether an exponentially rising or a falling function needs to be produced. The parameters P2 and P3 set the exponent. The parameter P4 indicates the initial amplitude. In this case, with every period of the clock signal CLK at the clock input 171, a new phase or frequency correction word PK is produced and is used to set a new frequency division ratio. This makes it possible to achieve optimum compensation for the phase drift in the voltage controlled oscillator.

Figure 4:
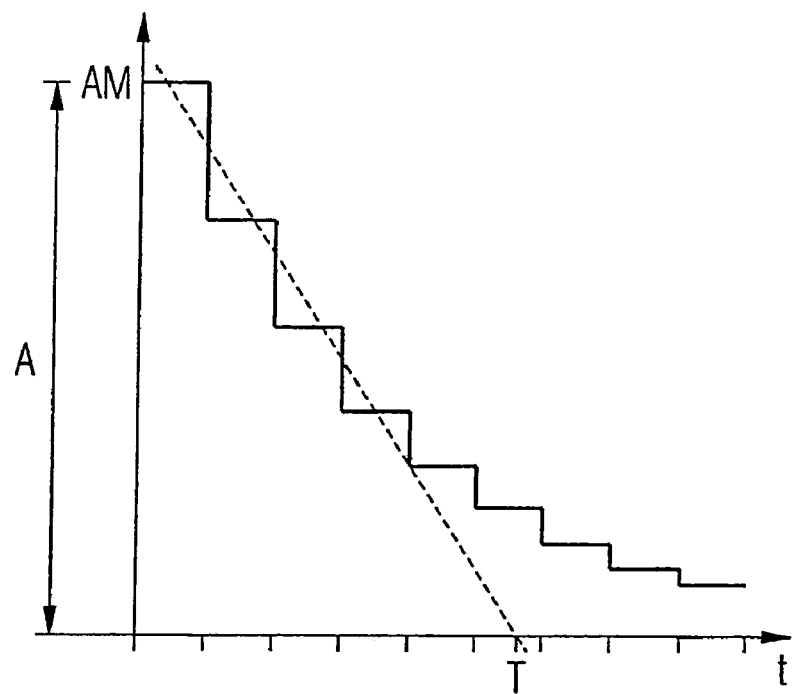
FIG. 4 is a graph illustrating a timing diagram for the frequency correction signal of the invention.
Figure 5:
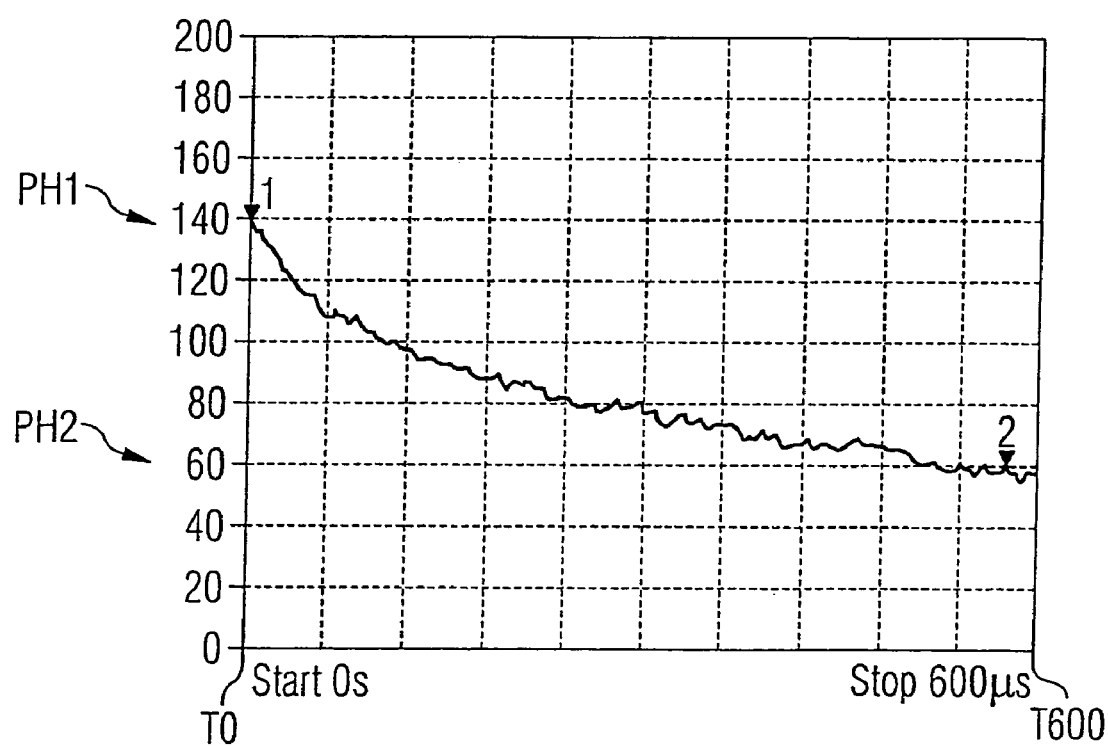
FIG. 5 is a graph illustrating a timing diagram for the phase drift in the output signal of a phase locked loop.

FIG. 4 shows the time profile of the output signal from the phase correction circuit 16. With every clock signal CLK, the value of the output signal changes in exponentially falling form. The time T represents the time constant of the exponential function. The output signal is supplied as a phase correction signal PK to the control circuit for producing a new frequency setting ratio. The frequency division ratios which are new after every clock signal CLK mean that the actuating signal from the phase detector in the phase locked loop is altered such that the phase drift in the voltage controlled oscillator is compensated for thereby.

The exemplary embodiment of a phase locked loop which is illustrated here is not limited to the assemblies used.

Instead of the control circuit which is in the form of a MASH modulator, it is possible to use any other control circuit for setting the frequency division ratio. Phase correction is also possible on a totally adaptive basis by evaluating the output signals from the loop filter or the voltage controlled oscillator. It is also possible for the phase correction apparatus used to be a circuit other than the exponential function generator illustrated here. However, the phase or frequency correction signal should preferably have the same time profile as the phase drift in the output signal from the phase locked loop.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A phase locked loop, comprising:
 a phase detector having a reference input, a feedback input, and a control output, wherein the phase detector is configured to output a control signal at the control output based on a frequency comparison of signals applied to the reference input and to the feedback input, respectively;
 a loop filter coupled to the control output of the phase detector and configured to produce and output a regulating signal at an output thereof;
 a frequency-controllable oscillator having a regulating input coupled to the output of the loop filter and configured to generate an output signal at a frequency ($f_{out}$), wherein the frequency ($f_{out}$) of the output signal is a function of the regulating signal at the regulating input thereof;
 a frequency divider circuit having a frequency division ratio (N) that is set at a setting input thereof, the frequency divider circuit further comprising an input connected to the output of the oscillator, and an output coupled to the feedback input of the phase detector, wherein the frequency divider circuit is configured to output a feedback signal at a frequency which is derived from the frequency ($f_{out}$) of the oscillator output signal and the frequency division ratio (N);
 a control circuit configured to output a setting signal to the setting input of the frequency divider circuit, wherein the control circuit is configured to produce the setting signal from a signal that defines the frequency division ratio to be set and a phase correction signal; and
 a phase correction apparatus configured to generate and output the phase correction signal to the control circuit, wherein the phase correction signal is derived from a time profile for a phase drift in the output signal of the oscillator.

2. The phase locked loop of claim 1, wherein the loop filter comprises a loop filter having a nonintegrating response.

3. The phase locked loop of claim 1, wherein the frequency divider circuit comprises a multimodulus divider configured to generate a frequency division ratio that is selectively variable in discrete steps.

4. The phase locked loop of claim 1, wherein the control circuit comprises a multistage modulator configured to derive the setting signal from the signal that defines the frequency division ratio.

5. The phase locked loop of claim 1, wherein the control input comprises a first input configured to receive a first signal defining an integer division ratio portion, and a second input configured to receive a second signal defining a fractional division ratio portion, wherein the first and second signals comprise the signal that defines the frequency division ratio.

6. The phase locked loop of claim 5, wherein the control circuit comprises a third input configured to receive a modulation signal that operates in conjunction with the first and second signals to define the division ratio for a frequency shift keying of the oscillator output signal.

7. The phase locked loop of claim 5, wherein the second input of the control circuit is coupled to an output of a delta-sigma modulator.

8. The phase locked loop of claim 1, wherein the phase correction apparatus comprises an exponential function generator configured to produce the phase correction signal, wherein the phase correction signal comprises a signal component with an exponential profile.

9. The phase locked loop of claim 8, wherein the exponential function generator of the phase correction apparatus comprises a plurality of adjustable function parameter inputs configured to receive adjustable function parameters for producing the signal component with an exponential profile.

10. The phase locked loop of claim 1, wherein the phase correction apparatus comprises a first input connected to the output of the loop filter and a second input connected to the output of the oscillator, and wherein the phase correction apparatus is configured to output the phase correction signal based on the regulating signal from the loop filter and the output signal from the oscillator.

11. A method for phase correction of a frequency controllable oscillator in a phase locked loop, comprising:
  providing the frequency controllable oscillator in the phase locked loop;
  producing a phase correction signal in response to a phase drift in an output signal of the oscillator;
  producing a frequency division ratio based on the phase correction signal;
  generating a signal having a frequency derived from division of a frequency of the oscillator output signal by the frequency division ratio;
  feeding back the divided signal for comparison with a reference signal; and
  producing a regulating signal from the comparison and applying the regulating signal to the oscillator in order to set its output frequency.

12. The method of claim 11, wherein producing the phase correction signal comprises producing a signal having a signal component with an exponential profile that corresponds to a profile of the phase or frequency drift within the oscillator.

13. The method of claim 11, wherein producing the frequency division ratio comprises producing a setting signal that is a function of an integer component of the frequency division ratio, a fractional component of the frequency division ratio, and the phase correction signal.

14. A phase locked loop circuit comprising:
  a voltage controlled oscillator configured to generate an output signal having a frequency that is a function of a regulating signal at an input thereof;
  a frequency divider circuit configured to divide down the frequency of the output signal based on a frequency divider ratio associated therewith, thereby generating a feedback signal;
  a phase detector configured to generate a signal associated with the regulating signal based on a comparison between the feedback signal and a reference signal; and
  a control circuit configured to generate a division ratio control signal based on a phase correction signal that is a function of the phase drift of the voltage controlled oscillator, wherein the division ratio control signal dictates the frequency divider ratio of the frequency divider circuit,
  wherein the frequency divider ratio is a function of a phase drift in the output signal from the voltage controlled oscillator.

15. The phase locked loop of claim 14, further comprising a loop filter configured to generate the regulating signal based on the signal generated by the phase detector, wherein the loop filter has a nonintegrating response associated therewith.

16. The phase locked loop of claim 14, wherein the control circuit further comprises integer and fractional division ratio control inputs, and a modulation input, wherein the control circuit is configured to generate the division ratio control signal based on the input states of the integer and fractional division ratio control inputs, the modulation input, and the phase correction signal.

17. The phase locked loop of claim 14, further comprising a phase correction circuit comprising a first input coupled to the input of the voltage controlled oscillator, and a second input coupled to the output of the voltage controlled oscillator, and configured to generate a phase correction signal based on signals at the first and second inputs reflective of a phase drift of the voltage controlled oscillator for use in generating the frequency divider ratio.

18. The phase locked loop of claim 17, further comprising a control circuit configured to generate a division ratio control signal based on the phase correction signal, wherein the control circuit further comprises integer and fractional division ratio control inputs, and a modulation input, and wherein the control circuit is configured to generate the division ratio control signal based on the input states of the integer and fractional division ratio control inputs, the modulation input, and the phase correction signal from the phase correction circuit.

19. The phase locked loop of claim 14, further comprising a phase correction circuit configured to generate and output a phase correction signal derived from a time profile of the phase drift of the oscillator, and wherein the frequency divider ratio is a function of the phase correction signal.

20. A phase locked loop circuit comprising:
  a voltage controlled oscillator configured to generate an output signal having a frequency that is a function of a regulating signal at an input thereof;
  a frequency divider circuit provided in a feedback path and connected to the output of the voltage control oscillator, and configured to divide down the frequency of the output signal based on a frequency divider ratio associated therewith, thereby generating a feedback signal; and
  a phase detector configured to generate a signal associated with the regulating signal based on a comparison between the feedback signal and a reference signal,
  wherein the frequency divider ratio used by the frequency divider circuit is adjusted by a frequency control word applied to a control input of the frequency divider circuit, and
  wherein the frequency divider ratio is a function of a time profile of a phase drift in the output signal from the voltage controlled oscillator.

21. The phase locked loop of claim 20, further comprising a loop filter configured to generate the regulating signal based on the signal generated by the phase detector, wherein the loop filter has a nonintegrating response associated therewith.

22. The phase locked loop of claim 20, further comprising a control circuit configured to generate a division ratio control signal based on a phase correction signal that is a function of the phase drift of the voltage controlled oscillator, wherein the division ratio control signal dictates the frequency divider ratio of the frequency divider circuit.

* * * * *